(12) United States Patent
Wu et al.

(10) Patent No.: US 6,754,106 B1
(45) Date of Patent: Jun. 22, 2004

(54) REFERENCE CELL WITH VARIOUS LOAD CIRCUITS COMPENSATING FOR SOURCE SIDE LOADING EFFECTS IN A NON-VOLATILE MEMORY

(75) Inventors: Yider Wu, San Jose, CA (US); Jean Yang, Sunnyvale, CA (US); Jiang Li, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/245,146

(22) Filed: Sep. 16, 2002

(51) Int. Cl.[7] .............................................. G11C 16/06
(52) U.S. Cl. .............................. 365/185.2; 365/185.21; 365/185.24
(58) Field of Search ........................ 365/185.2, 185.21, 365/185.24

(56) References Cited

U.S. PATENT DOCUMENTS 5,218,571 A * 6/1993 Norris .................... 365/185.18
6,128,227 A * 10/2000 Kim ...................... 365/185.21
2003/0043621 A1 * 3/2003 Wong .................... 365/185.03

* cited by examiner

Primary Examiner—Son Mai (57) ABSTRACT

A load circuit for compensating for source side loading effects in a non-volatile memory. Specifically, embodiments of the present invention describe a reference cell that is coupled to a plurality of load circuits. At least one of the plurality of load circuits, an $m^{th}$ load circuit, comprises a select transistor coupled to m resistors that are coupled in series. The $m^{th}$ load circuit matches a source side loading effect of a corresponding $m^{th}$ memory cell located m memory cells away from a source line node on a source line coupling source regions in memory cells of a row of memory cells.

23 Claims, 7 Drawing Sheets

REFERENCE CELL WITH VARIOUS LOAD CIRCUITS COMPENSATING FOR SOURCE SIDE LOADING EFFECTS IN A NON-VOLATILE MEMORY

TECHNICAL FIELD

The present invention relates to the field of microelectronic integrated circuits. Specifically, the present invention relates to a reference cell with various load circuits compensating for corresponding source side loading effects when reading non-volatile memory.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, floating gate and control gate to which various voltages are applied to program the cell with a binary 1 or 0, or erase all of the cells as a block. The flash memory cell provides for non-volatile data storage.

A typical configuration of a flash memory cell consists of a thin, high-quality tunnel oxide layer sandwiched between a conducting polysilicon floating gate and a crystalline silicon semiconductor substrate. The tunnel oxide layer is typically composed of silicon oxide ($Si_xO_y$). The substrate includes a source region and a drain region that can be separated by an underlying channel region. A control gate is provided adjacent to the floating gate, and is separated by an interpoly dielectric. Typically, the interpoly dielectric can be composed of an oxide-nitride-oxide (ONO) structure.

The flash memory cell stores data by holding charge within the floating gate. In a write operation, charge can be placed on the floating gate through hot electron injection, or Fowler-Nordheim (F-N) tunneling. In addition, F-N tunneling can be typically used for erasing the flash memory cell through the removal of charge on the floating gate.

Figure 1:
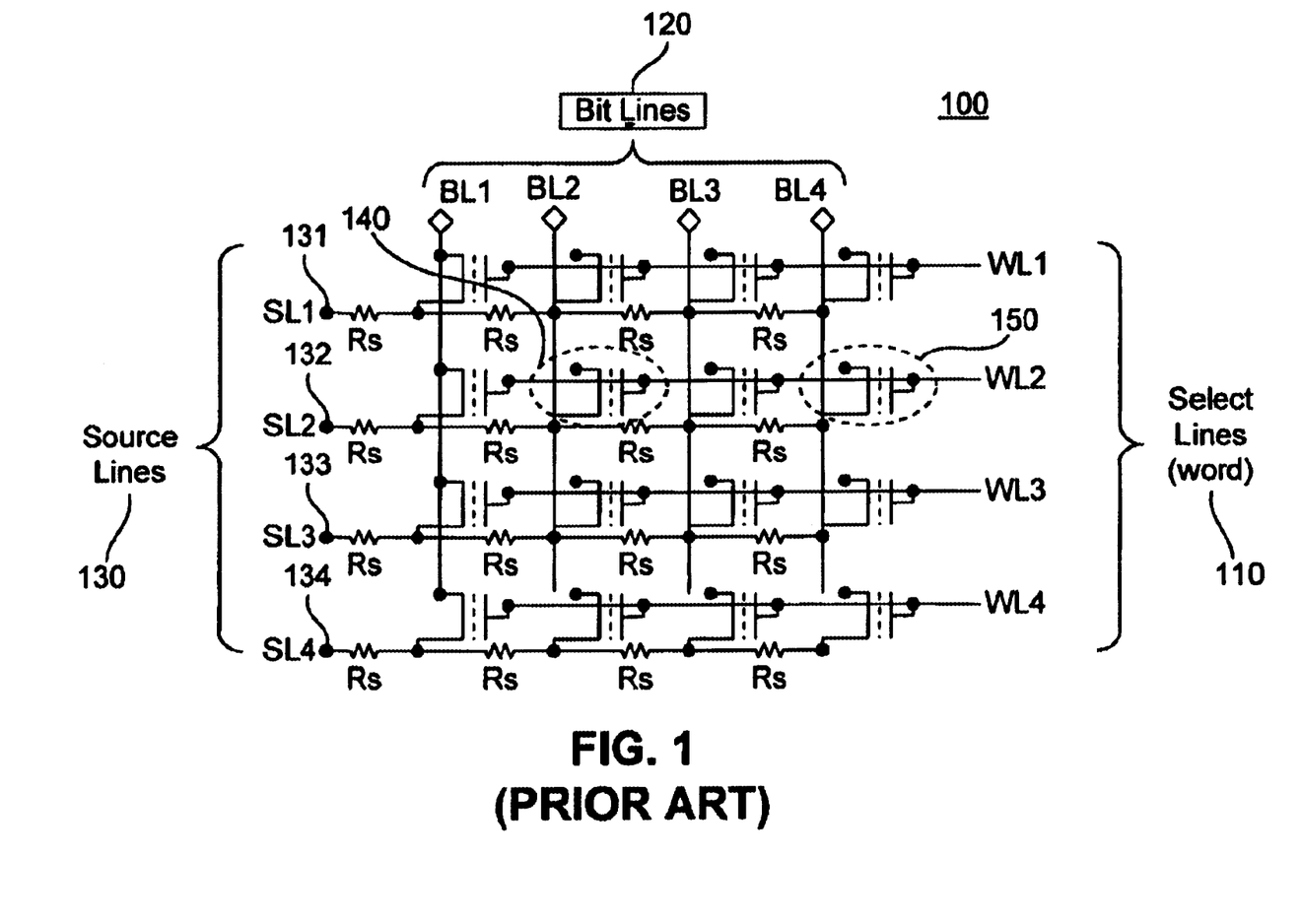
FIG. 1 is a circuit diagram illustrating the source side loading effects in an array of memory cells.

Prior Art FIG. 1 is a circuit diagram of a portion of an array 100 of memory cells arranged in a NOR type of configuration. The array 100 contains non-volatile flash memory cells arranged in rows and columns. A plurality of word lines 110, or select lines, are coupled to a plurality of rows of memory cells. The plurality of word lines 110 include WL1, WL2, WL3, and WL4. Each of the plurality of word lines 110 are coupled to gate regions of memory cells in their respective rows. For example, WL1 is coupled to gate regions of memory cells defined by WL1–BL1, WL1–BL2, WL1–BL3, and WL1–BL4, etc.

In addition, a plurality of bit lines 120 are coupled to a plurality columns of memory cells. The plurality of bit lines 120 include BL1, BL2, BL3, and BL4. The plurality of bit lines are coupled to drain regions of memory cells in their respective columns. For example, BL1 is coupled to drain regions of memory cells defined by WL1–BL1, WL2–BL1, WL3–BL1, and WL4-BL1.

In the array 100 of memory cells, a particular memory cell can be identified and read to determine if the cell is programmed or erased by applying the correct voltages to a corresponding bit line and word line. For example, in order to read the memory cell 140, appropriate voltages would be applied to bit line BL2 and word line WL2 to read the state of memory cell 140. Correspondingly, in order to read the memory cell 150, appropriate voltages would be applied to bit line BL4 and word line WL2 to read the state of memory cell 150.

A plurality of source lines 130 are coupled to each of the rows of memory cells. The plurality of source lines include SL1, SL2, SL3, and SL4. Each of the plurality of source lines 130 are coupled to source regions of memory cells in their respective rows. For example, SL1 is coupled to source regions of memory cells defined by WL1–BL1, WL1–BL2, WL1–BL3, and WL1–BL4, etc.

The plurality of source lines 130 are used to read current from identified memory cells in the array 100 of memory cells. For example, in order to determine the state of memory cell 140, appropriate voltages are applied to BL2 and WL2. When selected and activated, the memory cell 140 will produce a current through its respective source region that is read from an source line node 132 corresponding to its respective source line, SL2. Correspondingly, source line SL1 is coupled to source line node 131, SL3 is coupled to source line node 133, and SL4 is coupled to source line node 134.

Thereafter, the current from memory cell 140 is compared to a reference current of an approximately identical memory cell to determine its state, whether it is programmed (0) or erased (1). If the current from memory cell 140 is less than the reference current, then the memory cell 140 is in a programmed state (0), and its corresponding threshold voltage ($V_T$) is very high and should be higher than the threshold voltage of the reference cell ($V_{TRef}$). Correspondingly, if the current from memory cell 140 is more than the reference current, then the memory cell 140 is in an erased state (1), and its corresponding $V_T$ should be lower than $V_{TRef}$.

A problem with source side loading effects exists when reading memory cells in a row of memory cells in the array 100 of memory cells. For flash memory technology, the cells in an array 100 are erased simultaneously. After the erase process, the threshold voltage for each cell is checked individually. Current from each of the individual memory cells in the array 100 is compared to current from the reference cell to determine if the memory cell has been erased.

For NOR type flash configurations, the source lines are formed by implantation on silicon. As a material, silicon has a high unit resistance value. Since the resistance is relatively high, there are some source side loading effects. In particular, the resistance value of a particular source line increases as more and more of the source line is used to access memory cells along a row of memory cells.

Since the array is laid out more or less uniformly, the same distance of source line connects source regions of adjoining memory cells in a row of memory cells. That distance can be associated with a unit source side resistance value ($R_s$). For example, in the row of memory cells identified by SL2, the source side resistance for each of the memory cells is approximately as follows, in the following format, memory cell;resistance value: WL2–BL1;$R_s$, WL2–BL2;$2R_s$, WL2–BL3;$3R_s$, and WL2–BL4;$4R_s$.

Moreover, the source side loading effect will cause variation in the threshold voltages in a row of memory cells based on the location of the memory cell being accessed. For example, assuming that all the bits or memory cells in the array 100 of memory cells have the same approximate true $V_T$, when the same voltage is applied to respective word lines and bit lines, the same current and threshold voltage should approximately be read no matter the location of the memory device in the array 100, and in particular, along a single row of memory cells in the array 100.

However, because of the source side loading effects, the threshold voltage will increase the further away from the source line node of the respective source line from which the current is read. For example, for bit (WL2–BL4), the source side resistance is equal to $4R_s$, and the corresponding voltage increase for its threshold voltage would be equal to $4R_s$ times the current. For bit (WL2–BL2), the source side resistance is less and is equal to $2R_s$, and the corresponding voltage increase for its threshold voltage would be equal to $2R_s$ times the current.

Since the voltage drop at the source side for bits (WL2–BL4 and WL2–BL2) are different, even though the true $V_T$ is approximately identical for the bits (WL2–BL4 and WL2–BL2), during a read operation, the bit (WL2–BL2) will read more current because of lower source side resistance ($2R_s$), than for bit (WL2–BL4) with source side resistance ($4R_s$). As such, it appears that bit (WL2–BL2) has a lower $V_T$ than the $V_T$ for bit (WL2–BL4), when in fact the two $V_T$s are approximately equal. In addition, the apparent distribution of threshold voltages will increase due to the faulty readings of $V_T$ due to the source side loading effects.

The source side loading effects leads to over-erasure of memory cells within the array 100. In particular, during an erase operation, even though all the bits in the array 100 were erased to the same $V_T$, the bits with higher source side resistance (e.g., WL2–BL4) would appear to still be programmed, since its current is reduced. As such, the array 100 would be subjected to a further erase pulse, thereby lowering $V_T$ for the memory cells throughout the array 100. This causes memory cells to become over-erased (e.g., $V_T<0$), or for memory cells with lower source side resistance (e.g., WL2–BL2) to appear to be over-erased. Over-erasure of bits within the array 100 can cause bitline to bitline leakage within the array 100, leading to faulty readings from memory cells in a column having an over-erased memory cell.

In addition, to compensate for the increased distribution of threshold voltages due to the source side loading effects, the threshold voltages defining the program state and the erase state must be separated by a larger margin of voltage. This inhibits performance of 2 bit or 4 bit memory cell architecture, since the tolerance is small.

DISCLOSURE OF THE INVENTION

The present invention provides a reference cell with various load circuits compensating for source side loading effects in a non-volatile memory. As such, embodiments of the present invention provide for truer voltage threshold readings of memory cells in an array of memory cells. Embodiments of the present invention also provide for load circuits capable of compacting the voltage threshold distribution in an array of memory cells. Also, embodiments of the present invention provide for load circuits capable of wider margins between voltage thresholds of a program and erase state, thereby allowing for more efficient 2-bit or 4-bit multi-level cell architectures.

Specifically, embodiments of the present invention describe a reference cell that is coupled to a plurality of resistance or load circuits. The reference cell provides a reference current for the non-volatile memory comprising a plurality of memory cells. The reference cell is approximately identical to at least one of the plurality of memory cells.

At least one of the plurality of load circuits comprises a select transistor coupled to a plurality of resistors. The plurality of resistors are coupled in series. Each of the plurality of load circuits matches a source side loading effect of a corresponding memory cell in a non-volatile memory. As such, each of the plurality of load circuits reduces the reference current equal to a reduction in current from a corresponding memory cell due to its respective source side loading effect.

In particular, one of the plurality of load circuits, an $m^{th}$ load circuit, comprises a select transistor coupled to m resistors that are coupled in series. The $m^{th}$ load circuit matches a source side loading effect of a corresponding $m^{th}$ memory cell located m memory cells away from a source line node on a source line coupling source regions in memory cells of a row of memory cells.

BRIEF DESCRIPTION OF THE DRAWINGS

PRIOR ART

BEST MODES FOR CARRYING OUT THE INVENTION

Reference will now be made in detail to the preferred embodiments of the present invention, a reference cell with various load circuits compensating for source side loading effects in a non-volatile memory. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a plurality of load circuits that are coupled to a reference cell that compensate for source side loading effects in a non-volatile memory. As such, embodiments of the present invention provide for truer voltage threshold readings of memory cells in an array of memory cells. Also, embodiments of the present invention provide for load circuits capable of compacting the voltage threshold distribution in an array of memory cells. In addition, embodiments of the present invention provide for load circuits capable of wider margins between voltage thresholds of a program and erase state, thereby allowing for more efficient 2-bit or 4-bit multi-level cell architectures.

Figure 2:
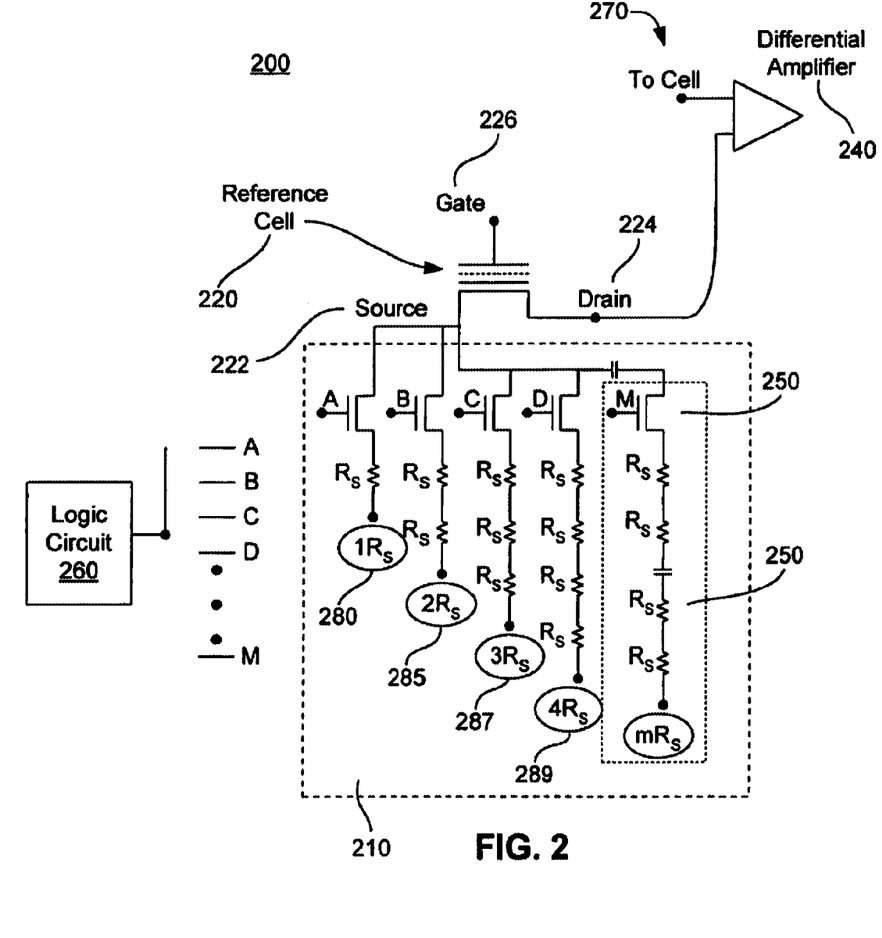
FIG. 2 is a circuit diagram of a reference cell coupled to a plurality of load circuits compensating for various source side loading effects, in accordance with one embodiment of the present invention.

FIG. 2 is a circuit diagram 200 capable of compensating for source side loading effects in a non-volatile memory, especially in a row of memory cells in an array of memory cells, in accordance with one embodiment of the present invention. The circuit 200 includes a reference cell 220 that is a flash memory cell, and includes a source region 222, a drain region 224, and a control gate region 226. The reference cell 220 is approximately identical to the plurality of memory cells in an array of memory cells of a non-volatile memory. The reference cell as well as the plurality of memory cells include a source, drain, floating gate and control gate to which various voltages can be applied to program the cell with a binary 1 or 0, or erase all of the cells as a block. The flash memory cell provides for non-volatile data storage.

Figure 7:
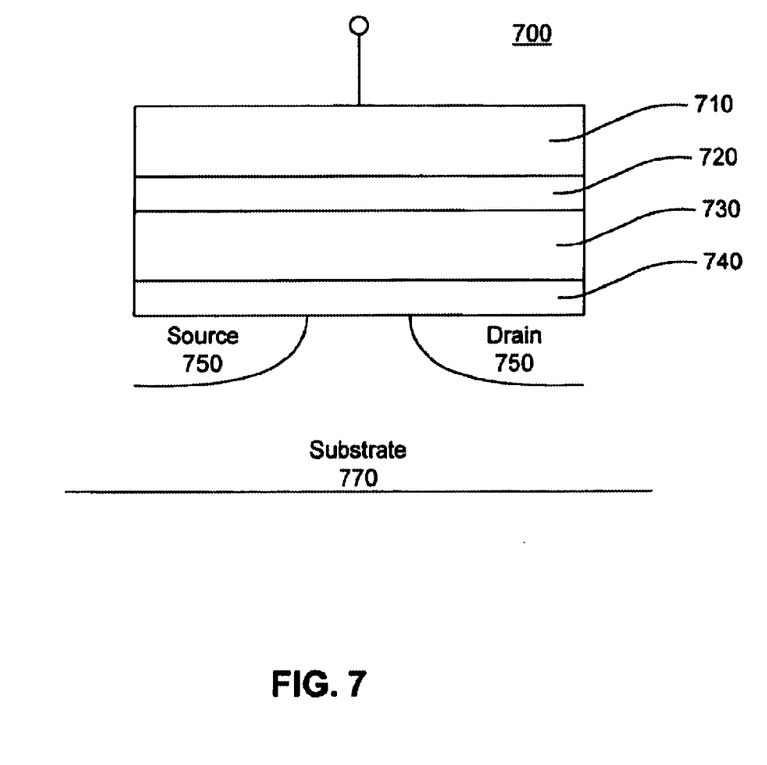
FIG. 7 is a cross-sectional view of a typical semiconductor flash memory cell, in accordance with one embodiment of the present invention.

A typical configuration of a memory cell 700, that is a flash memory cell, for implementation within the array of memory cells is shown in FIG. 7, in accordance with one embodiment of the present invention. The memory cell 700 consists of a thin, high-quality tunnel oxide layer 740 sandwiched between a conducting polysilicon floating gate 730 and a crystalline silicon semiconductor substrate 770. The tunnel oxide layer 740 is typically composed of silicon oxide ($Si_xO_y$). The substrate 770 includes a source region 760 and a drain region 750 that can be separated by an underlying channel region. A control gate 710 is provided adjacent to the floating gate 730, and is separated by an interpoly dielectric 720. Typically, the interpoly dielectric 720 can be composed of an oxide-nitride-oxide (ONO) structure.

While embodiments of the present invention are discussed within the context of the memory cell as described in FIG. 7, other embodiments of the present invention are well suited to arrays of memory cells suitable for and supporting a wide range of flash memories.

Returning back to FIG. 2, the reference cell provides a reference current 230 that corresponds to a reference threshold voltage ($V_T$). The reference current and reference $V_T$ is used for comparing currents and threshold voltages of memory cells in the array of memory cells of the non-volatile memory to determine whether those memory cells are in a programmed stated or erased state. For example, those cells with very low current and threshold voltages above the reference $V_T$ are in a programmed state (0). Those cells with high current and threshold voltages below the reference $V_T$ are in an erased state (1).

The array of memory cells in the non-volatile memory contains non-volatile flash memory cells which can be arranged in rows and columns for a NOR type of configuration, in accordance with one embodiment of the present invention. The array of memory cells can be the array 100 as shown in Prior Art FIG. 1. As such, a plurality of word lines are coupled to a plurality of rows of memory cells. Each of the plurality of word lines is coupled to gate regions of memory cells in their respective rows. In addition, a plurality of bit lines are coupled to a plurality columns of memory cells. The plurality of bit lines are coupled to drain regions of memory cells in their respective columns. A plurality of source lines are coupled to each of the rows of memory cells. The plurality of source lines coupled to source regions of memory cells in their respective rows.

In the array of memory cells, a particular memory cell can be identified and read to determine if the cell is programmed or erased by applying the correct voltages to a corresponding bit line and word line and reading the current from the corresponding source line.

A differential amplifier 240 inputs the reference current 230 and the current from an identified memory cell 270 in the array of memory cells of the non-volatile memory for comparison purposes. The output to the differential amplifier 240 determines whether the current from the identified memory cell 270 is in a programmed or erased state, as discussed previously.

The circuit diagram 200 illustrates the plurality of load or resistance circuits 210 compensating for various source side loading effects in the non-volatile memory. Each of the plurality of load circuits 210 comprises a select transistor coupled to a plurality of resistors that are coupled in series. The resistance circuit matches source side loading effects for a corresponding memory cell in the array of memory cells of the non-volatile memory. In one embodiment, the plurality of load circuits 210 are coupled in parallel to a source region 222 of the reference cell 220.

Figure 3:
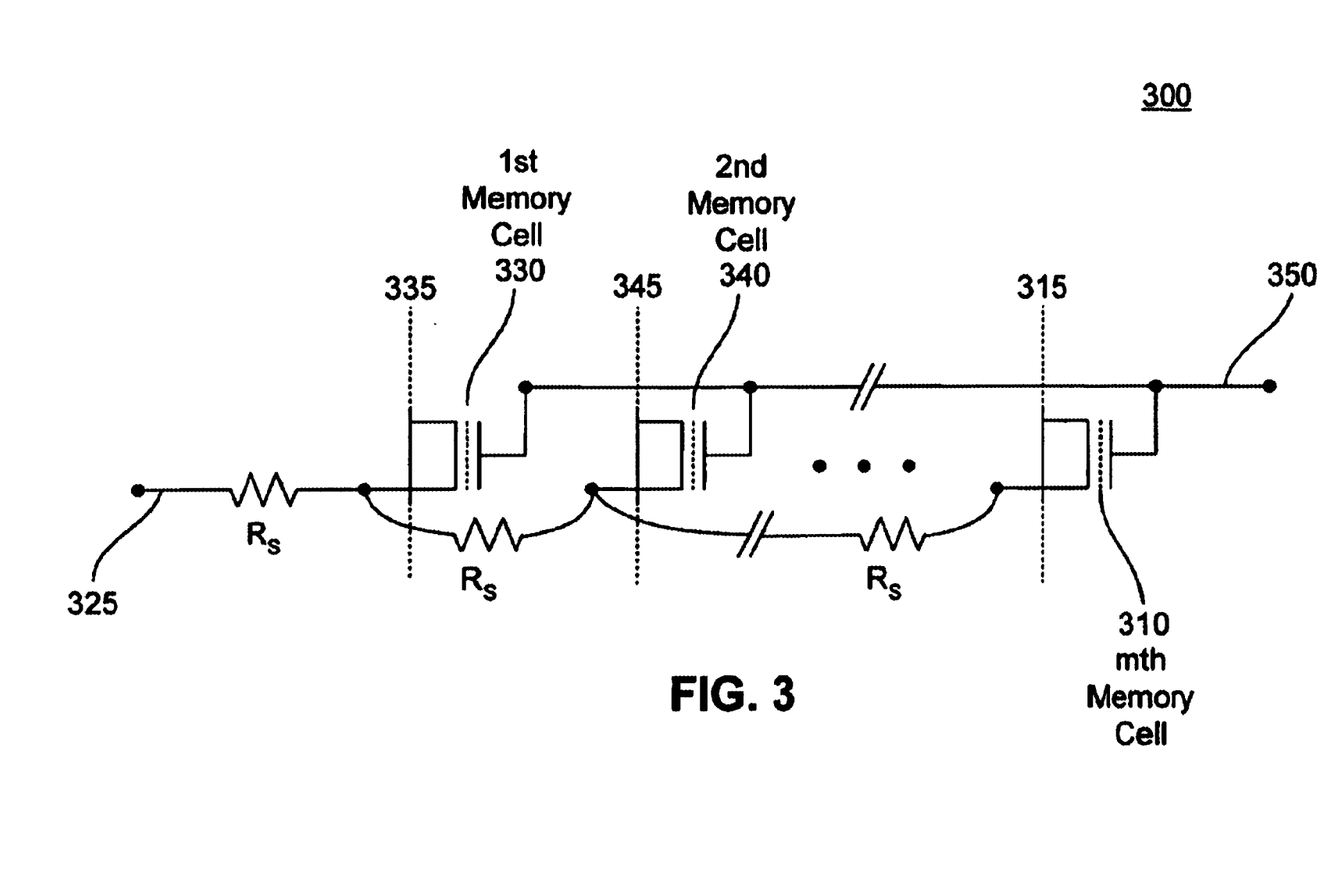
FIG. 3 is a circuit diagram of a row of memory cells in an array of memory cells of a non-volatile memory, in accordance with one embodiment of the present invention.

More particularly, the plurality of load circuits 210 compensates for source side loading effects associated with a row 300 of memory cells, as shown in FIG. 3. The row 300 of memory cells includes a first memory cell 330 that is in a first column of memory cells. Bit line 335 couples drain regions of each of the memory cells in the first column. The row 300 also includes a second memory cell 340 that is in a second column of memory cells. Bit line 345 couples drain regions of each of the memory cells in the second column. As shown in FIG. 3, the row 300 of memory cells includes multiple memory cells as shown by the $m^{th}$ memory cell 310 that is in an $m^{th}$ column of memory cells. Bit line 315 coupled drain regions of each of the memory cells in the $m^{th}$ column.

A word line 350 couples the control gate regions of each of the memory cells 330, 340, on up to 310 of the row 300 of memory cells. In addition, a source line 320 couples source regions of the memory cells 330, 340, on up to 310 of the row 300 of memory cells. Source line 320 couples the source regions of the memory cells 330, 340, on up to 310 in series. Also, a source line node 325 is coupled to the source line 320 for reading current from the row 300 of memory cells.

As discussed previously, for NOR type flash configurations, the source lines are formed by implantation on silicon. As a material, silicon has a high unit resistance value. Since the resistance is relatively high, there are some source side loading effects. In particular, the resistance value of a particular source line increases as more and more of the source line is used to access memory cells along a row of memory cells.

Since the array of memory cells in the non-volatile memory is laid out more or less uniformly, the same distance of source line connects source regions of adjoining memory cells in the row 300 of memory cells. That distance can be associated with a unit source side resistance value ($R_s$). As such, the source side resistance value of the memory cell 330 located one memory cell away from the source line node 325 is $R_s$. The source side resistance value of the memory cell 340 located two memory cells away from the source line node 325 is $2R_s$. Correspondingly, the source side resistance value of the $m^{th}$ 310 memory cell, that is located m memory cells away from the source line node 325, is $mR_s$.

Returning now to FIG. 2, the plurality of load circuits 210 compensates for source side loading effects associated with the row 300 of memory cells. For example, the load circuit 280 includes a select transistor A and a single load resistance ($R_s$) that compensates for the source side loading effects associated with memory cell 330, that is located one memory cell away from the source side node 325. Also, the load circuit 285 includes a select transistor B and two load resistances ($2R_s$) coupled in series that compensates for the source side loading effects associated with memory cell 340, that is located two memory cells away from the source side node 325.

The plurality of load circuits 210 proceeds in such manner and includes an $m^{th}$ load circuit 250 that comprises a select transistor M coupled to m resistors that are coupled in series. The $m^{th}$ load circuit matches and compensates for the source side loading effects associated with the $m^{th}$ memory cell 310 in the row 300 of memory cells. The $m^{th}$ memory cell 310 is located m memory cells away from the source side node 325.

The circuit diagram 200 also includes a logic or switching circuit 260 for selecting between the plurality of load circuits 210. The logic circuit 260 selects between each of the select transistors (e.g., A, B, C, D, on up to M). The select transistors are selected depending on which memory cell in the row 300 of memory cells is being read. When selected, the select transistor is activated and the respective load circuit provides a resistance load on the reference cell 220.

As such, a load circuit, when selected, reduces the reference current equal to a reduction in current of the corresponding memory cell due to source side loading effects. For example, the $m^{th}$ load circuit 250, when selected, reduces the reference current 230 to match a reduction in current from the corresponding $m^{th}$ memory cell, that is being read, 310 due to source side loading effects.

Figure 4:
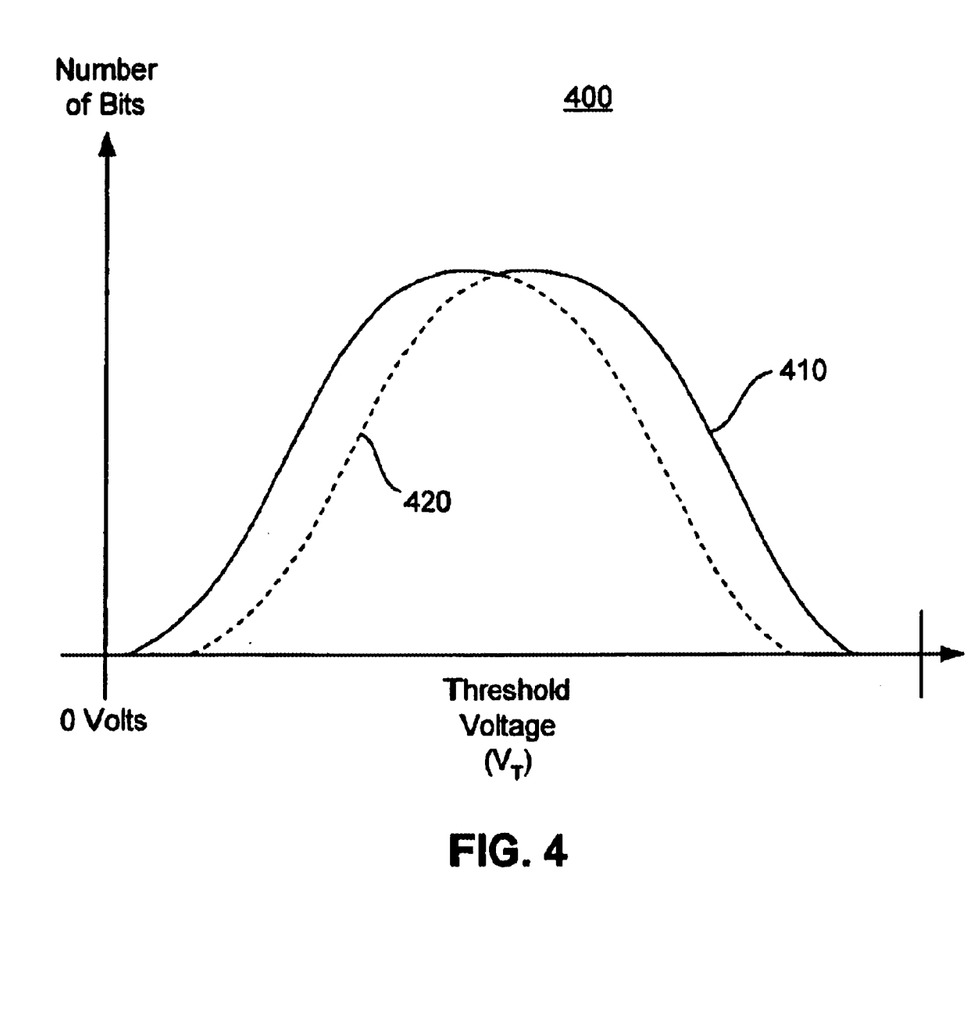
FIG. 4 is a chart illustrating the compaction in the distribution of threshold voltages in an array of memory cells after compensating for various source side loading effects in a non-volatile memory, in accordance with one embodiment of the present invention.

FIG. 4 is a chart 400 illustrating the distribution of voltage thresholds as a function of the number of bits on an array of memory cells, in accordance with one embodiment of the present invention. The array of memory cells is coupled to a reference cell that compensates for source side loading effects. The chart 400 includes the Gaussian distribution, as is shown by curved line 410, of threshold voltages of the array of memory cells before any compensation for source side loading effects.

Curved line 420 illustrates the Gaussian distribution of threshold voltages of the array of memory cells after compensating for source side loading effects. Curved line 420 is shown juxtaposed against curved line 410 (without source side loading compensation) to illustrate the compaction of the distribution of threshold voltages provided when compensating for source side loading effects with the reference cell 220 and the plurality of load circuits 210, as is shown in FIG. 2.

Since the same source side loading effect occurs at the reference cell 220 and the memory cell that is being read, the source side loading effect is therefore cancelled. As such, the $V_T$ of the memory cell that is being read is a true $V_T$ no matter what the associated source side loading effects may be. This is reflected by the more compact distribution of $V_T$ throughout the array of memory cells in a non-volatile memory.

Moreover, because the $V_T$ that is read is a true $V_T$ for the memory cell being read, there is less possibility that a false $V_T$ is being read due to source side loading effects. As such, unnecessary erase processes can be avoided. This is especially the case when memory cells with high source side resistance values are fully erased, but due to the source side loading effect, show a false programmed state requiring a further erasure process that is unnecessary. As such, avoidance of over-erasure of memory cells with lower source side loading effects can be avoided, which leads to reduced bitline to bitline leakage.

Another advantage provided for in the reference cell with load circuits compensating for source side loading effects is the increase in margin for voltage thresholds in a memory cell, in accordance with one embodiment of the present invention. Increased margins are beneficial for multi-level programming in 2-bit and 4-bit cell architectures.

A multi-level cell (e.g., a four state cell) utilizes three reference threshold voltages to represent the four states (00, 01, 10, and 11). The memory cell is programmed to different voltage levels to represent the aforementioned two-bit combinations. Multi-level cells have reduced margins between threshold levels, and as such, the multi-level cells are more sensitive to errors.

Figure 5:
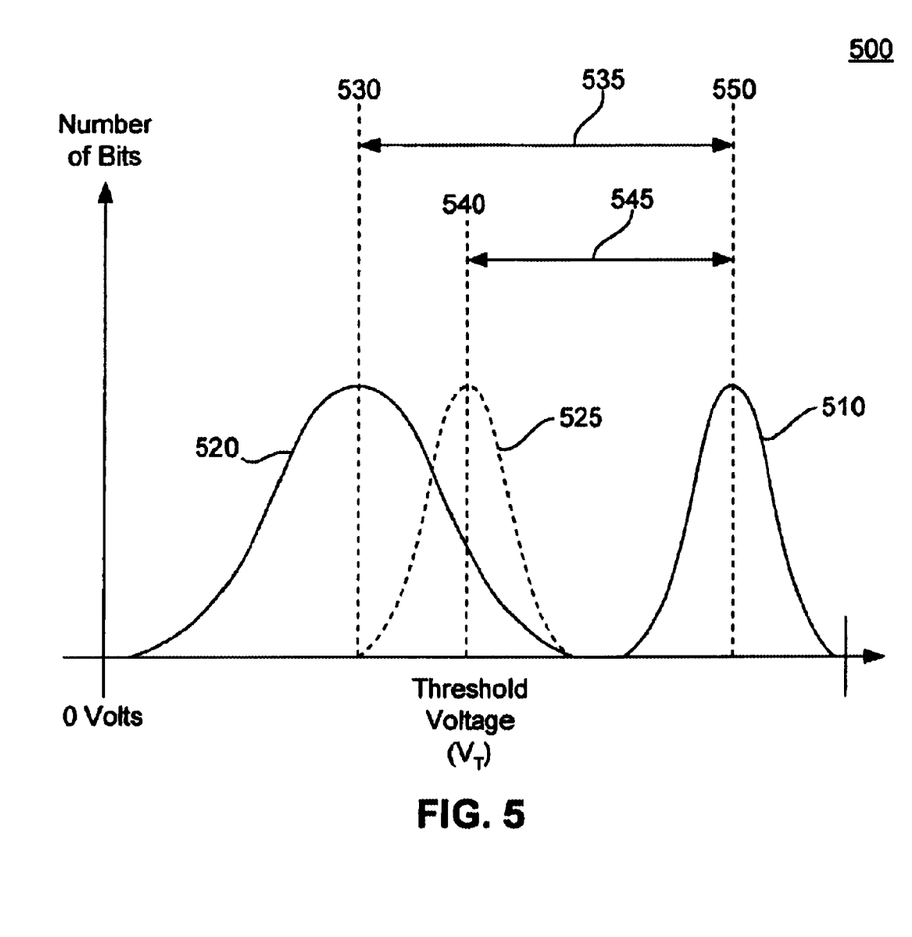
FIG. 5 is a chart illustrating the reduction in required margin between threshold voltages of a program state and an erase state after compensating for various source side loading effects in a non-volatile memory, in accordance with one embodiment of the present invention.

FIG. 5 is a chart 500 illustrating the distribution of voltage thresholds for a programmed and an erased state as a function of the number of bits on an array of memory cells, in accordance with one embodiment of the present invention. The chart 500 includes the Gaussian distribution, as is shown by curved line 510, of threshold voltages of the array of memory cells in a programmed state.

Curved line 520 illustrates the Gaussian distribution of voltage thresholds for an array of memory cells in an erased state before any compensation for source side loading effects. To provide for enough margin between the distribution of voltage thresholds in a programmed and erased state, a voltage distance 535, as defined by center lines 530 and 550, is necessary to distinguish between the programmed and erased states.

Curved line 525 illustrates the Gaussian distribution of voltage thresholds for the array memory cells in an erased state after compensation for source side loading effects. As is shown in FIG. 5, the distribution illustrated by curved line 525 is more compact than the distribution illustrated by curved line 520. As such, if the distribution in curved line 525 was centered about center line 530, there would be more margin available between the distribution of threshold voltages in a programmed state, curved line 510, and the erased state.

With a more compact distribution, an increase in the number of voltage threshold distributions is possible for a memory cell while maintaining adequate margins between the distributions. A tighter and more compact distribution is beneficial in multi-level memory cells with various voltage levels defining various memory states. With tighter distribution of threshold voltages, the various voltage levels are more defined and separated from each other. As such, more voltage levels can be implemented.

In particular, the voltage distribution 525 in FIG. 5, illustrating the erased state, that compensates for source side loading effects can be shifted to be centered at line 540. The distribution illustrated by curved line 525 is shifted closer to the voltage threshold distribution 510 signifying a programmed state, thereby allowing for further programming levels associated with a single memory cell. In FIG. 5, the center of the programmed and erased $V_T$ distributions are separated by a voltage difference 545 that is smaller than the original voltage separation 535. Thus, compensating for source side loading effects provides for better and wider process margins allowing for more efficient 2-bit architecture and 4-bit cell architectures.

Figure 6:
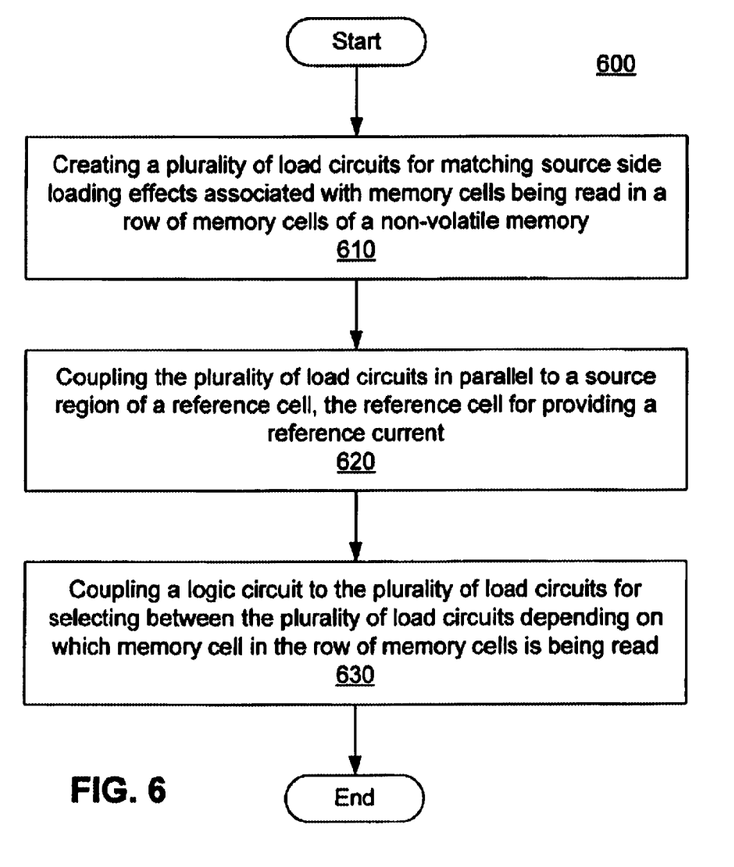
FIG. 6 is a flow chart illustrating steps in a method for compensating for various source side loading effects in a non-volatile memory, in accordance with one embodiment of the present invention.

FIG. 6 is a flow chart 600 illustrating steps in a computer implemented method for compensating for source side loading effects in an array of memory cells of a non-volatile memory, in accordance with one embodiment of the present invention. The present embodiment begins with a non-volatile memory device that comprises at least one array of memory cells. The memory cells in the array are arranged in a plurality of rows and a plurality of columns. A plurality of word lines are coupled to the plurality of rows. A plurality of bit lines are coupled to the plurality of columns. In one embodiment, the array of memory cells can be arranged in a NOR type non-volatile memory.

The present embodiment begins by creating a plurality of load circuits for matching source side loading effects associated with memory cells being read in a row of memory cells of a non-volatile memory, in step 610. Each of the plurality of load circuits comprise a select transistor coupled to a plurality of resistances coupled in series for matching a source side loading effect of a corresponding memory cell in the array of memory cells.

For example, an $m^{th}$ load circuit is created by the present embodiment that comprises a select transistor coupled to m resistors that are coupled in series. The $m^{th}$ load circuit matches a source side loading effect of a corresponding $m^{th}$ memory cell located m memory cells away from an source line node on a source line coupling source regions in memory cells of the row of memory cells.

In step 620, the present embodiment couples the plurality of load circuits in parallel to a source region in the reference cell. The reference cell provides a reference current for determining programming and erased states in memory cells of an array of memory cells of a non-volatile memory.

In step 630, the present embodiment couples a logic circuit to the plurality of load circuits for selecting between the plurality of load circuits.

In step 640, the present embodiment selects the load circuit as determined by which memory cell is being read in a row of memory cells. The load circuit matches the source side resistance loading effects associated with the memory cell that is being read. In this way, current from the memory cell that is being read approximately matches the reference current that is reduced by a corresponding load that matches the source side loading effects as seen by the memory cell being read.

The present embodiment couples a differential amplifier to the reference cell and to a source line of the row of memory cells to compare the reference current against current from a memory cell being read in the non-volatile memory. In this way, the present embodiment determines whether the memory cell that is being read is in a programmed or erased state.

The preferred embodiment of the present invention, a reference cell with various source side load circuits compensating for source side loading effects, is thus described. While the present invention has been described in particular embodiments, it should be appreciated that the present invention should not be construed as limited by such embodiments, but rather construed according to the below claims.

What is claimed is:

1. A load circuit comprising:
   a select transistor of an $m^{th}$ load circuit in a plurality of load circuits; and
   m resistors coupled in series, said m resistors coupled to said $m^{th}$ load circuit, said $m^{th}$ load circuit for matching a source side loading effect of a corresponding $m^{th}$ memory cell located m memory cells away from a source line node on a source line coupling source regions in memory cells of a row of memory cells by reducing in series current contributions of a voltage associated with said source line node.

2. The load circuit as described in claim 1, wherein said plurality of load circuits are coupled to a reference cell, said reference cell for providing a reference current for a non-volatile memory comprising a plurality of memory cells, said reference cell approximately identical to at least one of said plurality of memory cells.

3. The load circuit as described in claim 2, wherein each of said plurality of load circuits reduces said reference current equal to a reduction in current of a corresponding memory cell due to source side loading effects.

4. The load circuit as described in claim 2, wherein said $m^{th}$ load circuit, when selected, reduces said reference current equal to a reduction in current of said corresponding $m^{th}$ memory cell due to said source side loading effects.

5. The load circuit as described in claim 2, wherein said plurality of load circuits are coupled in parallel to a source region in said reference cell.

6. The load circuit as described in claim 1, further comprising:
   a switching circuit coupled to said plurality of load circuits for selecting respective load circuits.

7. The load circuit as described in claim 1, wherein said source side loading effect of said $m^{th}$ memory cell is approximately equal to m multiplied by a unit source side load value, said unit load value equal to resistance values for each of said m resistors.

8. The load circuit as described in claim 1, further comprising:
   a differential amplifier coupled to said load circuit and to a source line of said row of memory cells, said differential amplifier for comparing a reference current, reduced by said $m^{th}$ load circuit, against current read from said source line from said $m^{th}$ memory cell.

9. A load circuit comprising:
   a reference cell for providing a reference current for a non-volatile memory comprising a plurality of memory cells, said reference cell approximately identical to at least one of said plurality of memory cells; and
   a plurality of load circuits coupled to said reference cell, wherein at least one of said plurality of load circuits comprises a select transistor coupled to a plurality of resistors that are coupled in series for matching a source side loading effect of a corresponding memory cell in said non-volatile memory by reducing in series current contributions from a source line voltage coupled to said reference cell.

10. The load circuit as described in claim 9, further comprising:
    a logic circuit for selecting between each of said plurality of selection circuits for matching source side loads associated with memory cells being read in a row of memory cells of said non-volatile memory.

11. The load circuit as described in claim 10, wherein said select transistor when selected by said logic circuit, turns on said select transistor for reducing said reference current with said plurality of resistors.

12. The load circuit as described in claim 9, wherein said reference cell and each of said plurality of memory cells is a floating gate memory cell comprising:
  a control gate;
  a floating gate separated from said control gate by a dielectric layer; and
  an oxide layer separating said floating gate from a channel region separating a source region and a drain region in a substrate.

13. The load circuit as described in claim 9, wherein said plurality of load circuits are coupled in parallel to a source region of said reference cell.

14. The load circuit as described in claim 9, wherein said plurality of load circuits comprises N load circuits corresponding to N memory cells in a row of memory cells of said non-volatile memory, and wherein an $m^{th}$ resistor circuit in said plurality of load circuits comprises:
  a select transistor coupled to m resistors, said m resistors coupled in series, said $m^{th}$ resistor circuit corresponding to an $m^{th}$ memory cell located m memory cells away from a source line node on a source line coupled to said row of memory cells, said source line coupling in series source regions in said row of memory cells.

15. The load circuit as described in claim 14, wherein each of said memory cells in said row of memory cells has an associated source side load value equal to a unit source side load value multiplied by the number of memory cells away from said source line node said associated source side load value is measured from, said unit source side load value approximately identical to load values for each of said plurality of resistors.

16. The load circuit as described in claim 9, wherein said non-volatile memory comprises:
  at least one array of memory cells from said plurality of memory cells arranged in a plurality of rows and a plurality of columns, each of said memory cells in said array comprising a source region and a drain region, and capable of storing a respective bit;
  a plurality of word lines coupled to respective rows of said memory cells;
  a plurality of bit lines coupled to respective columns of said memory cells; and
  a plurality of source lines wherein at least one of said plurality of source lines corresponds to a respective row of memory cells in said plurality of rows, and couples in series source regions of memory cells in said respective row.

17. A method for matching source side loading effects in a non-volatile memory comprising:
  creating a plurality of load circuits for matching source side loads associated with memory cells being read in a row of memory cells of a non-volatile memory;
  coupling said plurality of load circuits in parallel to a source region in a reference cell to reduce in series current contributions of a voltage associated with a source line node as from said source side loads, said reference cell for providing a reference current; and
  selecting between said plurality of load circuits depending on which memory cell in said row of memory cells is being read.

18. The method as described in claim 17, wherein said creating said plurality of load circuits further comprises:
  creating an $m^{th}$ load circuit comprising a select transistor coupled to m resistors that are coupled in series, said $m^{th}$ load circuit for matching a source side loading effect of a corresponding $m^{th}$ memory cell located m memory cells away from a source line node on a source line coupling source regions in memory cells of said row of memory cells.

19. The method as described in claim 17, further comprising:
  comparing said reference current against current from a memory cell being read in said non-volatile memory.

20. The method as described in claim 17, wherein said non-volatile memory comprises:
  at least one array of memory cells from said plurality of memory cells arranged in a plurality of rows and a plurality of columns, each of said memory cells in said array comprising a source region and a drain region, and capable of storing a respective bit;
  a plurality of word lines coupled to respective rows of said memory cells;
  a plurality of bit lines coupled to respective columns of said memory cells; and
  a plurality of source lines wherein at least one of said plurality of source lines corresponds to a respective row of memory cells in said plurality of rows, and couples in series source regions of memory cells in said respective row.

21. The method as described in claim 17, wherein said selecting between said plurality of load circuits is performed with a logic circuit.

22. The method as described in claim 18, wherein said selecting between said plurality of load circuits reduces said reference current approximately equal to a reduction in current of a corresponding memory cell being read due to source side loading effects.

23. The method as described in claim 17, further comprising:
  coupling a differential amplifier to said reference cell and to a source line of said row of memory cells, said differential amplifier for comparing said reference current, reduced by a corresponding load circuit, against current read from said source line from a corresponding memory cell.

* * * * *